(12) United States Patent
Hirayama et al.

(10) Patent No.: US 7,141,961 B2
(45) Date of Patent: Nov. 28, 2006

(54) METHOD AND DEVICE FOR GENERATING CLOCK SIGNAL

(75) Inventors: Hideki Hirayama, Gifu-ken (JP); Tomofumi Watanabe, Gifu-ken (JP); Masashi Kiyose, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 28 days.

(21) Appl. No.: 11/044,736

(22) Filed: Jan. 27, 2005

(65) Prior Publication Data
US 2005/0168253 A1   Aug. 4, 2005

(30) Foreign Application Priority Data
Jan. 30, 2004   (JP)  .............................. 2004-022818

(51) Int. Cl.
*G01R 19/00* (2006.01)
(52) U.S. Cl. .............................. 324/76.19; 324/76.53; 327/156
(58) Field of Classification Search ..................... None
See application file for complete search history.

(56) References Cited

U.S. PATENT DOCUMENTS 5,386,437 A * 1/1995 Yasuda ....................... 375/376

\* cited by examiner

*Primary Examiner*—Vincent Q. Nguyen
(74) *Attorney, Agent, or Firm*—Fish & Richardson P.C.

(57) ABSTRACT

A method and device for generating a clock signal accurately synchronized with a wobble signal including jitter even if there are manufacturing differences between voltage controlled oscillators. The clock signal generation device includes a voltage controlled oscillator for generating a clock signal corresponding to each of a plurality of oscillation characteristics. The clock signal generation device applies a test voltage to a voltage controlled oscillator with a voltage control device and sequentially identifies a plurality of oscillation characteristics set for the voltage controlled oscillator. The clock signal generation device selects one of the identified oscillation characteristics that has a frequency range with a generally middle part in which the frequency of a wobble signal is located and has a smaller gain.

7 Claims, 4 Drawing Sheets

Fig.3
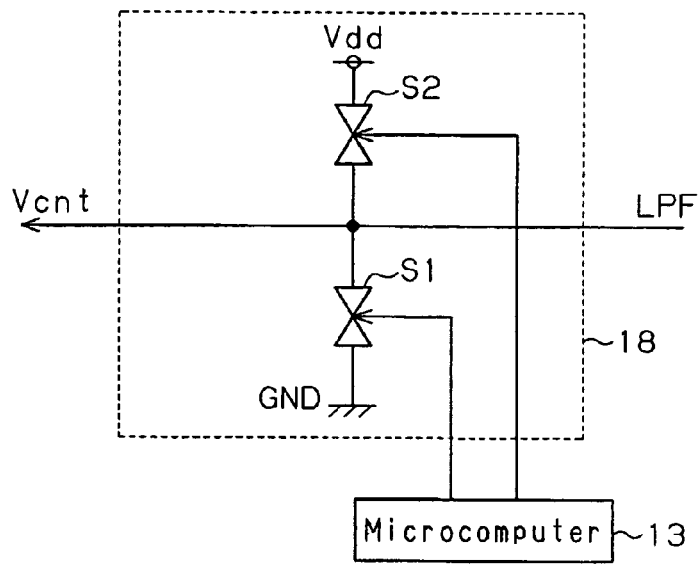
Fig.4
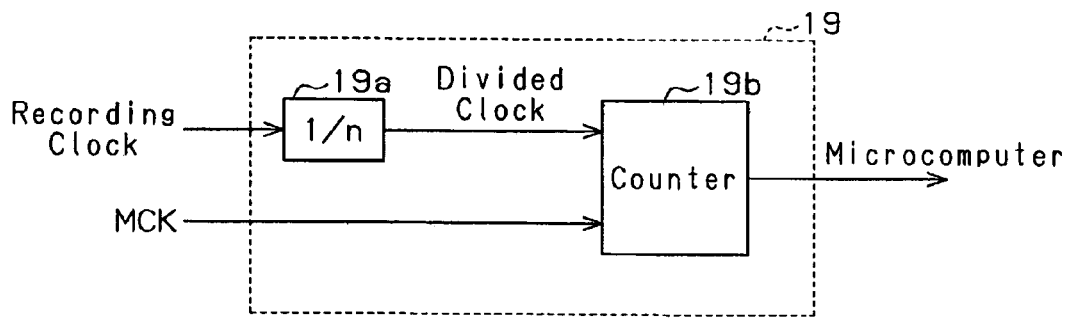
Fig.5(a) Recording Clock 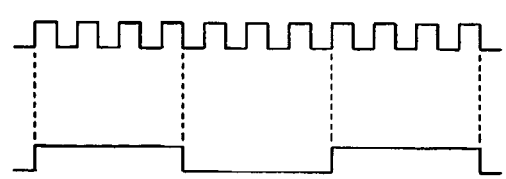
Fig.5(b) Divided Clock 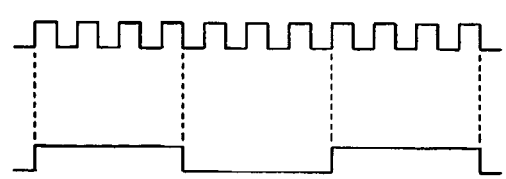
Fig.5(c) Master Clock MCK 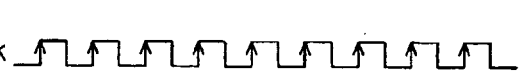

METHOD AND DEVICE FOR GENERATING CLOCK SIGNAL

CROSS-REFERENCE TO RELATED APPLICATIONS

This application is based upon and claims the benefit of priority from the prior Japanese Patent Application No. 2004-22818, filed on Jan. 30, 2004, the entire contents of which are incorporated herein by reference.

BACKGROUND OF THE INVENTION

The present invention relates to a method and device for generating a clock signal synchronized with an input cycle signal.

In the prior art, a clock signal generation device is incorporated in, for example, an optical disc device capable of recording data to a recordable type optical disc, such as a digital versatile disc-recordable (DVD-R), to generate a recording clock signal used as a reference when recording data. The clock signal generation device normally includes a phase lock loop (PLL) circuit. A recording process is performed based on the recording clock signal generated by the clock signal generation device. Data recording is accurately performed in accordance with the rotation speed of the disc using the recording clock signal.

The recording clock signal is generated based on a wobble signal, which has a predetermined cycle and which is generated from the slight wobble of a guide groove (pregroove) formed on substantially the entire optical disc, or an LPP signal, which is generated from land prepits (LPPs) arranged at predetermined intervals along a track. In the optical disc device, when reproducing the data recorded on an optical disc, a reproduction clock signal may be generated to perform processing in accordance with the rotation speed of the optical disc.

Fluctuations in the rotation of the disc or tilting of the disc may produce jitter. Such jitter would shift the wobble signal in the direction of the time axis. Thus, the jitter may affect and shift the clock signal, which is generated from the wobble signal. As a result, the recording and reproduction of data may not be performed in a satisfactory manner. Accordingly, in the prior art, the gain of the PLL circuit is minimized to suppress the influence of jitter. Especially, in a voltage controlled oscillator (VCO) that configures a PLL circuit, an oscillation characteristic capable of generating the clock signal required by the optical disc device while minimizing the gain is set based on simulations conducted beforehand. The clock signal is generated based on the oscillation characteristic.

The setting of the oscillation characteristic of the voltage controlled oscillator in accordance with a minimized gain reduces the influence of jitter. However, there is a possibility that the required clock signal cannot be generated when voltage controlled oscillators have manufacturing differences. In other words, the use of a voltage controlled oscillator having a low gain oscillation characteristic narrows the applicable frequency band. Thus, if a deviation occurs in the oscillation characteristic due to manufacturing differences, when there is a request for the generation of a clock signal having a frequency corresponding to, for example, four times the disc rotation speed, there is a possibility that the voltage controlled oscillator cannot generate a clock signal with the required frequency. As a result, the setting of the oscillation characteristic of the voltage controlled oscillator in accordance with a minimized gain makes it difficult to cope with manufacturing differences. This may, in turn, reduce the recording and reproduction quality.

The problem caused by manufacturing differences between voltage controlled oscillators is not limited to a clock signal generation device incorporated in an optical disc device and may also occur in any clock signal generation device that generates a clock signal synchronized with a cycle signal including jitter.

SUMMARY OF THE INVENTION

The present invention provides a method and device for generating a clock signal that is synchronized with a cycle signal including jitter even if there are manufacturing differences between voltage controlled oscillators.

One aspect of the present invention is a method for generating a clock signal. The method includes preparing a voltage controlled oscillator for generating a clock signal corresponding to each of a plurality of oscillation characteristics in accordance with a control voltage, sequentially identifying each of the oscillation characteristics by applying a test voltage to the voltage controlled oscillator, selecting one of the oscillation characteristics that is suitable for the frequency of a cycle signal and has a smaller gain, setting the voltage controlled oscillator with the selected oscillation characteristic, and generating the clock signal synchronized with the cycle signal in accordance with the set oscillation characteristic by applying the control voltage to the voltage control oscillator.

Another aspect of the present invention is a device for generating a clock signal synchronized with a cycle signal. The device includes a voltage controlled oscillator for generating a clock signal corresponding to each of a plurality of oscillation characteristics in accordance with a control voltage. A voltage control device, connected to the voltage controlled oscillator, applies a test voltage to the voltage controlled oscillator to select one of the oscillation characteristics set for the voltage controlled oscillator. A frequency detector, connected to the voltage controlled oscillator, detects the frequency of the clock signal generated by the voltage controlled oscillator in accordance with the applied test voltage.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 3 is a schematic circuit diagram of the voltage controlled oscillator in the clock signal generation circuit of FIG. 1;

FIG. 4 is a schematic block diagram of a frequency detector in the clock signal generation circuit of FIG. 1;

FIGS. 5(a) to 5(c) are waveform charts illustrating frequency detection modes of the frequency detector shown in FIG. 4.

DETAILED DESCRIPTION OF THE PREFERRED EMBODIMENTS

A clock signal generation device 100 according to a preferred embodiment of the present invention will now be described with reference to FIGS. 1 to 5. The clock signal generation device 100 is applied to an optical disc device capable of recording data to a DVD-R/RW disc.

Figure 1:
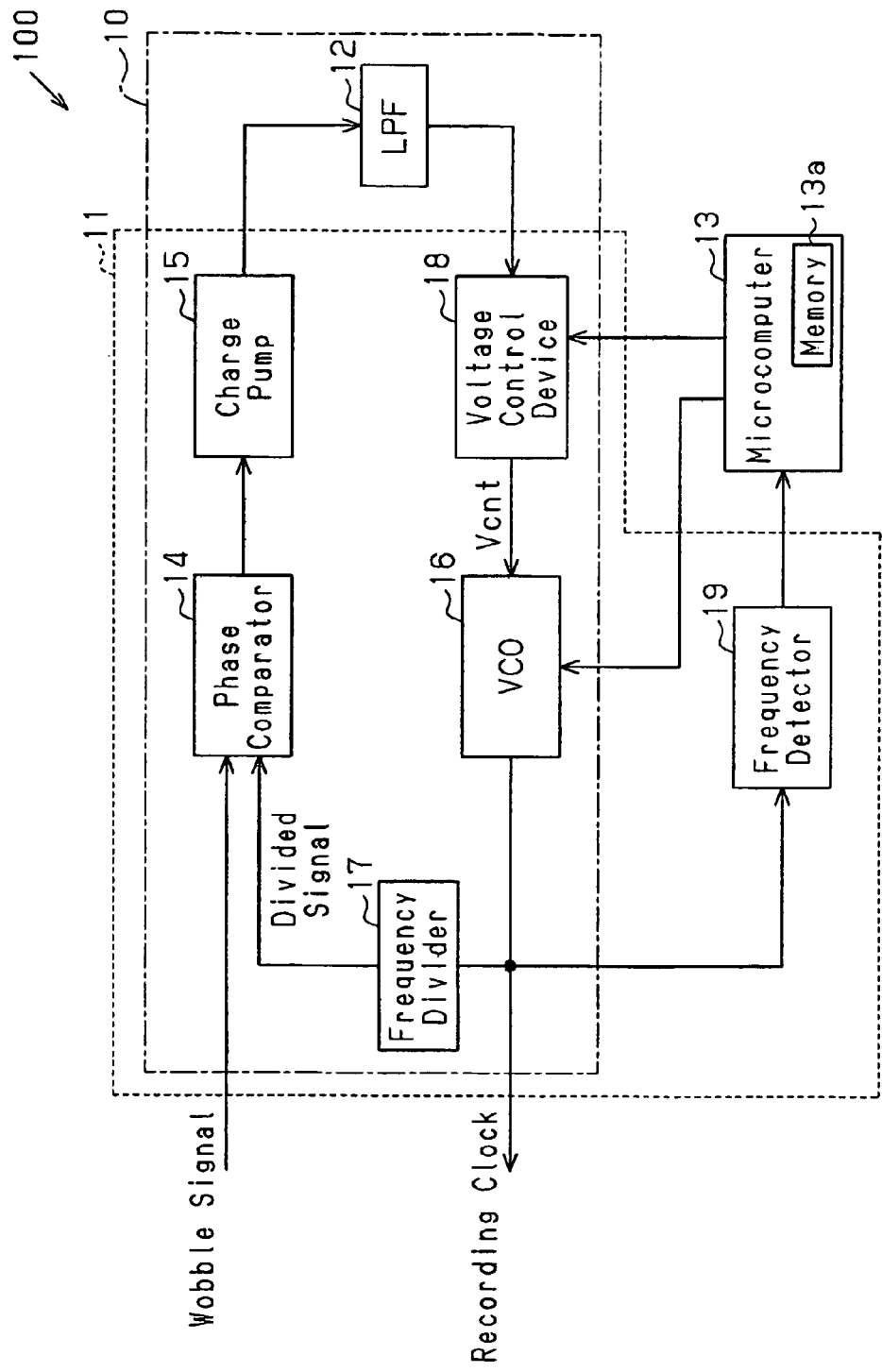
FIG. 1 is a schematic block diagram of a clock signal generation circuit according to a preferred embodiment of the present invention.

Referring to FIG. 1, the clock signal generation device 100 includes a clock signal generation circuit 11, a low pass filter (LPF) 12, and a microcomputer 13, which is connected to the clock signal generation circuit 11 and which functions as an external controller. The low pass filter 12 and part of the clock signal generation circuit 11 configure a PLL circuit 10.

The clock signal generation circuit 11 includes a phase comparator 14, a charge pump 15, a voltage controlled oscillator 16, a frequency divider 17, a voltage control device 18, and a frequency detector 19, which are all configured on the same semiconductor chip substrate.

The phase comparator 14 receives a wobble signal, which functions as a cycle signal read from an optical disc by the optical disc device. Then, the phase comparator 14 compares the phase of the wobble signal with the phase of a divided signal of a recording clock signal output from the voltage controlled oscillator 16 to supply the charge pump 15 with voltage corresponding to the phase difference.

The charge pump 15 supplies the voltage corresponding to the phase difference from the phase comparator 14 to the low pass filter 12 to control the charging and discharging of the low pass filter 12 with the voltage corresponding to the phase difference. This control supplies the voltage controlled oscillator 16 via the voltage control device 18 with control voltage which corresponds to the output voltage of the charge pump 15 and is sent from the low pass filter 12.

Figure 2A:
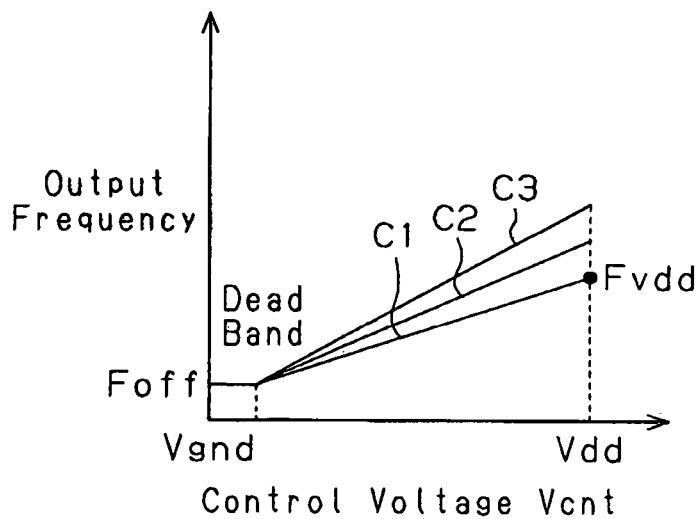
FIGS. 2(a) to 2(c) are graphs showing the oscillation characteristic of a voltage controlled oscillator in the clock signal generation circuit of FIG. 1.
Figure 2B:
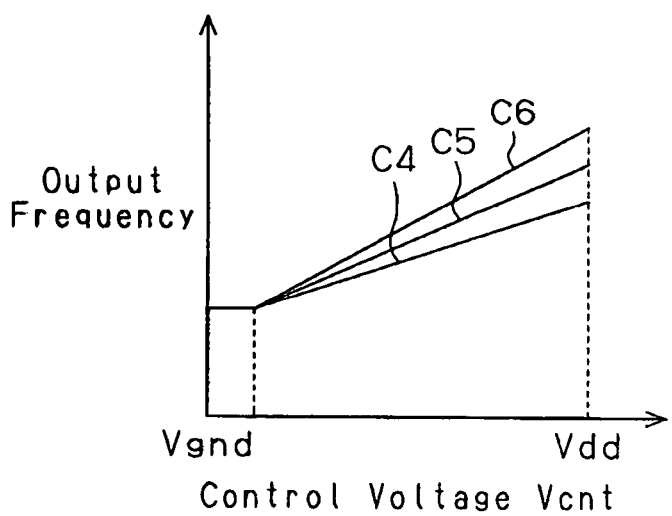
Figure 2C:
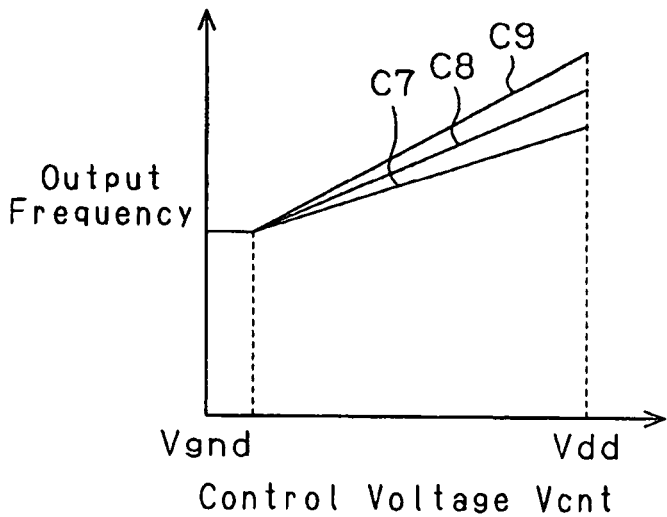

The voltage controlled oscillator 16 generates a clock signal having a frequency corresponding to the supplied control voltage. The voltage controlled oscillator 16 has a plurality of oscillation characteristics with regard to the relationship between the control voltage and the frequency (output frequency) of the generated clock signal. A different offset frequency and different voltage-frequency conversion gain is set for each oscillation characteristic. More specifically, as shown in FIGS. 2(a) to 2(c), nine types of (three offset frequencies×three gains) oscillation characteristics C1 to C9 are set for the voltage controlled oscillator 16 in the preferred embodiment. The oscillation characteristics C1 to C3 shown in FIG. 2(a) are set having the same offset frequency but different gains (inclinations). Oscillation characteristic C3 has the highest gain. Oscillation characteristics C4 to C6 and C7 to C9 shown in FIGS. 2(b) and 2(c) respectively have the same gains as oscillation characteristics C1 to C3 but have different offset frequencies.

One of the oscillation characteristics C1 to C9 set by the voltage controlled oscillator 16 is set through the control performed by the microcomputer 13. More specifically, a certain combination is set from the offset frequencies and gains. When control voltage Vcnt from the low pass filter 12 is applied to the voltage controlled oscillator 16 via the voltage control device 18, the voltage controlled oscillator 16 generates a clock signal (recording clock signal) having a frequency corresponding to the control voltage Vcnt in accordance with the oscillation characteristic set by the microcomputer 13 (i.e., one of oscillation characteristics C1 to C9). The recording clock signal output from the voltage controlled oscillator 16 is divided in the PLL circuit 10 by the frequency divider 17 to generate a divided signal fed back to the phase comparator 14. The PLL circuit 10 repeats such feedback operation to synchronize the recording clock signal (more accurately, the divided signal of the recording clock signal) output from the voltage controlled oscillator 16 with the wobble signal.

In the preferred embodiment, the voltage controlled oscillator 16 oscillates clock pulses in accordance with one of oscillation characteristics C1 to C9. When there are manufacturing differences in the voltage controlled oscillator 16, the designed characteristic may differ from the actual characteristic. Thus, in the preferred embodiment, the clock signal generation circuit 11 includes the voltage control device 18 and the frequency detector 19 so that the microcomputer 13 identifies (measures) the oscillation characteristic of the voltage controlled oscillator 16 and sets one of the oscillation characteristics C1 to C9 based on the measurement result. The configuration of the voltage control device 18 and the frequency detector 19 and the procedure for identifying the oscillation characteristic will now be described in detail.

The voltage control device 18 applies a test voltage to the voltage controlled oscillator 16 in accordance with a command from the microcomputer 13. More specifically, the voltage control device 18 is configured by a switching circuit shown in FIG. 3, in which the microcomputer 13 activates switch S1 and inactivates switch S2 to apply ground voltage Vgnd, which is the minimum control voltage (potential) Vcnt, to the voltage controlled oscillator 16. Further, the microcomputer 13 inactivates the switch S1 and activates the switch S2 to apply power supply voltage Vdd, which is the maximum control voltage (potential) Vcnt, to the voltage controlled oscillator 16. In such cases, to ensure that the control voltage Vcnt is set to the ground voltage Vgnd or the power supply voltage Vdd, the microcomputer 13 sets the output of the low pass filter 12 to high impedance. Normally, the switches S1 and S2 are kept inactivated, and the control voltage Vcnt output from the low pass filter 12 is directly applied to the voltage controlled oscillator 16. That is, when generating the recording clock signal synchronized with the wobble signal, the microcomputer 13 controls the voltage control device 18 so that both of the switches S1 and S2 are kept inactivated.

The frequency detector 19 receives the recording clock signal output from the voltage controlled oscillator 16 and detects the frequency of the recording clock signal. More specifically, referring to FIG. 4, the frequency detector 19 includes a frequency divider 19a, which has a predetermined frequency division ratio, and a counter 19b. The frequency divider 19a divides the frequency of the recording clock signal (FIG. 5(a)) output from the voltage controlled oscillator 16 to generate a divided clock signal (FIG. 5 (b)). The counter 19b compares the divided clock signal with a master clock signal MCK (FIG. 5(c)) generated by an external oscillation circuit (not shown) to detect the frequency of the recording clock signal. That is, the counter 19b counts the number of times the master clock signal MCK goes high during one cycle of the divided clock signal. Whenever the divided clock signal goes high, the counter 19b provides the microcomputer 13 with a count value of the master clock signal MCK and clears the count vale to re-start counting.

In the microcomputer 13, the frequency division ratio of the frequency divider 19a and the frequency (cycle) of the master clock signal MCK is preset. Based on the count value provided from the counter 19b of the frequency detector 19, the frequency division ratio of the frequency divider 19a, and the frequency (cycle) of the master clock signal MCK, the microcomputer 13 calculates the frequency (cycle) of the recording clock signal output from the voltage controlled oscillator 16. The microcomputer 13 stores the frequency obtained through the calculation in a memory 13a, which functions as a storage means (e.g., EEPROM)

Figure 6:
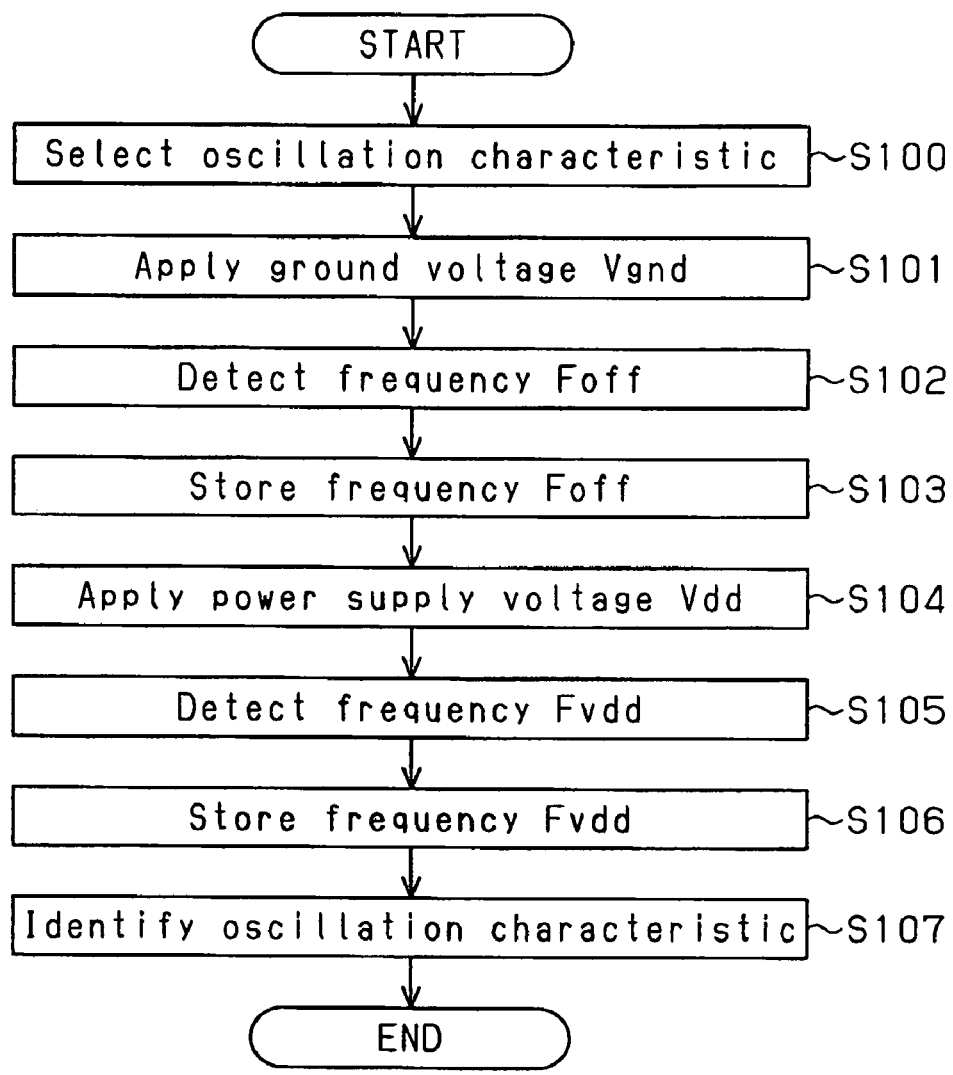
FIG. 6 is a flowchart showing an identification process for the oscillation characteristic of the voltage controlled oscillator.

The specific procedure for identifying (measuring) each offset frequency and gain of the oscillation characteristics C1 to C9 set for the voltage controlled oscillator 16 will now be discussed with reference to the flowchart of FIG. 6. In this embodiment, the microcomputer 13 performs this procedure whenever the optical disc device is activated.

During the identification process, in step S100, the microcomputer 13 first selects one of the oscillation characteristics C1 to C9 for the voltage controlled oscillator 16 and sets the voltage controlled oscillator 16 with the selected oscillation characteristic. In this example, the microcomputer 13 selects the offset frequency and the gain corresponding to the oscillation characteristic C1 (refer to FIG. 2(a)).

In step S101, the microcomputer 13 controls the voltage control device 18 to inactivate the switch S2 and activate the switch S1 (refer to FIG. 3) and apply the ground voltage Vgnd, which is the minimum control voltage Vcnt, as the test voltage to the voltage controlled oscillator 16. The voltage application generates a clock signal, which has frequency Foff, from the voltage controlled oscillator 16 as shown in FIG. 2(a).

In step S102, the microcomputer 13 detects the frequency Foff from the count value of the counter 19b in the frequency detector 19. In step S103, the microcomputer 13 stores the detected frequency Foff in the memory 13a.

In step S104, the microcomputer 13 inactivates the switch S1 and activates the switch S2 in the voltage control device 18 and applies the power supply voltage Vdd, which is the maximum control voltage Vcnt, as the test voltage to the voltage controlled oscillator 16. The voltage application generates a clock signal having the maximum frequency Fvdd in oscillation characteristic C1 as shown in FIG. 2(a). In this state, in step S105, the microcomputer 13 detects the frequency Fvdd based on the count value of the counter 19b in the frequency detector 19, and, in step S106, stores the detected frequency Fvdd in the memory 13a.

In step S107, the microcomputer 13 identifies oscillation characteristic C1 presently set for the voltage controlled oscillator 16. That is, the microcomputer 13 identifies the frequency Foff obtained in steps S102 and S103 as the offset frequency and identifies the gain based on the relationship between the offset frequency and the maximum frequency Fvdd obtained in steps S105 and S106. The gain is obtained from the inclination of the oscillation characteristic C1 exemplified in FIG. 2(a). As shown in FIG. 2(a), the oscillation characteristic C1 normally includes a dead band from the ground voltage Vgnd to approximately 0.7 V. Thus, the microcomputer 13 obtains the gain taking into consideration the dead band. The microcomputer 13 stores the obtained gain in the memory 13a and then ends processing.

Subsequently, the microcomputer 13 sequentially sets the offset frequency and the gain for the other oscillation characteristics and repeats the processing of steps S100 to S107. The microcomputer 13 then temporarily stores every identified offset frequency and gain of the oscillation characteristics C1 to C9 in the memory 13a.

When the optical disc device actually records data on a DVD-R or a DVD-RW, the optical disc device sends a command of, for example, "4× speed write" to the microcomputer 13. In accordance with the command, the microcomputer 13 selects a suitable one of the oscillation characteristics C1 to C9 for the "4× speed write" command and sets the voltage controlled oscillator 16 to the selected oscillation characteristic. More specifically, the microcomputer 13 selects a suitable oscillation characteristic so that the wobble signal frequency assumed from the rotation speed of the optical disc (4× speed) is included in the frequency range of the selected oscillation characteristic at the generally middle part of the frequency range and so that the oscillation characteristic has a smaller gain. In accordance with the oscillation characteristic set for the voltage controlled oscillator 16, the clock signal generation circuit 11 generates the recording clock signal synchronized with the wobble signal.

The clock signal generation device 100 of this embodiment has the advantages described below.

(1) The voltage controlled oscillator 16 has a plurality of different oscillation characteristics and generates a clock signal having one of the oscillation characteristics. A test voltage is applied to the voltage controlled oscillator 16 to identify a plurality of actual oscillation characteristics including manufacturing differences. A suitable one is selected from the identified oscillation characteristics, the selected oscillation characteristic is set for the voltage controlled oscillator 16, and a clock signal is generated in accordance with the set oscillation characteristic. The suitable oscillation characteristic is selected so that the assumed wobble signal frequency is included in the frequency range of the selected oscillation characteristic at the generally middle part of the frequency range and such that the oscillation characteristic has a smaller gain. That is, the oscillation characteristics C1 to C9 are identified based on the test voltage before selecting the suitable oscillation characteristic satisfying the above conditions. Accordingly, even if there are manufacturing differences between voltage controlled oscillators 16, the clock signal is generated accurately synchronized with a cycle signal including jitter. In addition, the oscillation characteristic is selected so that the assumed frequency of the cycle signal is at the generally middle part of the frequency range for the oscillation characteristic. This enables deviations of the cycle signal frequency to be coped with in a wide rage. Thus, a more stable and more accurate clock signal is generated.

(2) The microcomputer 13 applies the ground voltage Vgnd, which is the minimum control voltage Vcnt, and the power supply voltage Vdd, which is the maximum control voltage Vcnt, to the voltage controlled oscillator 16 as test voltages. The frequency detector 19 detects the frequencies Foff and Fvdd of the clock signal generated in this state. That is, the minimum and maximum oscillation frequencies of the oscillation characteristic for the voltage controlled oscillator are both detected to efficiently and accurately identify the offset frequency and gain for each oscillation characteristic.

(3) The microcomputer 13 controls the voltage controlled oscillator 16 and the voltage control device 18. Further, the microcomputer 13 performs the series of processes from the identification of the oscillation characteristics C1 to C9 for the voltage controlled oscillator 16 to the setting of the oscillation characteristic for the voltage controlled oscillator 16. In other words, the process for setting the oscillation characteristic is performed only by the microcomputer 13. This increases the freedom of processing and enables efficient processing.

(4) The offset frequency and gain of each of the identified oscillation characteristics C1 to C9 are stored in the memory 13a. This enables the microcomputer 13 to select the oscillation characteristic based on each oscillation characteristic stored in the memory 13a. Thus, the process for setting the oscillation characteristic may be readily performed.

(5) The oscillation characteristics C1 to C9 are identified whenever the optical disc device is activated. Thus, when the environment in which the optical disc device is used greatly changes or when the dependency of the voltage controlled oscillator 16 in an environment including differences is great, a suitable one of the oscillation characteristics may be selected in accordance with the environment.

It should be apparent to those skilled in the art that the present invention may be embodied in many other specific forms without departing from the spirit or scope of the invention. Particularly, it should be understood that the present invention may be embodied in the following forms.

The same frequency divider may be used as the frequency divider 17 and the frequency divider 19a. For example, when using only the frequency divider 17, the divided signal of the frequency divider 17 is provided to the counter 19b.

The frequency calculation based on the output of the frequency detector 19 may be performed through a map calculation based on a ROM table or the like.

The timing and number of the identification process for the oscillation characteristics is not limited and may be performed, for example, only once before the manufactured product is shipped out of the factory. In this case, it is necessary that the environment in which the optical disc device does not change greatly or that the dependency of the voltage controlled oscillator 16 in an environment including differences is small.

A median voltage between the maximum voltage and the minimum voltage may be applied to the voltage controlled oscillator 16 to identify a plurality of characteristic frequencies. That is, since each oscillation characteristic is determined by the combination of the offset frequency and the gain, when either the offset frequency or the gain is accurate, the other one of the offset frequency and the gain may be predicted from the frequency of the clock signal generated by the voltage controlled oscillator 16, to which the median voltage is applied. More specifically, when the offset frequency is accurate, the gain, or the inclination of the oscillation characteristic, is calculated from the frequency obtained by the application of the median voltage, the offset frequency, the minimum voltage corresponding to the offset frequency, and the median voltage. When the gain is accurate, the offset frequency is calculated from the gain corresponding to the frequency obtained by the application of the median voltage, or the inclination. In this manner, the offset frequency and the gain of each oscillation characteristic may be predicted by applying the intermediate voltage as the test voltage. This simplifies the identification of each oscillation characteristic.

The offset frequency and gain of each of the identified oscillation characteristics C1 to C9 may be stored in a memory (storage means) arranged inside or outside the clock signal generation circuit 11. This enables the microcomputer 13 to select the oscillation characteristics C1 to C9 based on the identification information stored in the memory when, for example, the microcomputer 13 is connected to the clock signal generation circuit 11.

The oscillation characteristic does not necessarily have to be selected from the oscillation characteristics C1 to C9 so that the assumed frequency of the cycle signal is at the generally middle part of the frequency range for the oscillation characteristic. The oscillation characteristic may be selected so that the wobble signal frequency is included in the frequency range.

The present invention may be applied to a device that generates a reproduction clock signal used as a reference when reproducing the data recorded on the optical disc.

The application of the present invention is not limited to a device that generates a recording clock signal for a DVD-R/RW. For example, the present invention may be applied to a device for generating a recording clock signal for use in other types of optical discs, such as a CD-R/RW or a Blu-ray disc. Thus, the present invention may be applied to any type of optical disc device using a clock signal synchronized with a cycle signal.

The clock signal generation device of the present invention need only have at least the clock signal generation circuit 11 configured on a single semiconductor chip substrate. The clock signal generation device need only have at least the voltage controlled oscillator 16, the voltage control device 18, and the frequency detector 19. The voltage control device 18 is employed to apply the test voltage to the voltage controlled oscillator 16, and the frequency detector 19 is employed to monitor and identify the oscillation characteristic of the voltage controlled oscillator 16.

The present examples and embodiments are to be considered as illustrative and not restrictive, and the invention is not to be limited to the details given herein, but may be modified within the scope and equivalence of the appended claims.

What is claimed is:

1. A method for generating a clock signal, the method comprising:
    preparing a voltage controlled oscillator for generating a clock signal corresponding to each of a plurality of oscillation characteristics in accordance with a control voltage, wherein the plurality of oscillation characteristics are combinations of a plurality of offset frequencies and a plurality of gains for voltage-frequency conversion;
    sequentially identifying each of the oscillation characteristics by applying a test voltage to the voltage controlled oscillator;
    selecting one of the oscillation characteristics that is suitable for the frequency of a cycle signal and has a smaller gain;
    setting the voltage controlled oscillator with the selected oscillation characteristic; and
    generating the clock signal synchronized with the cycle signal in accordance with the set oscillation characteristic by applying the control voltage to the voltage control oscillator.

2. The method according to claim 1, wherein each of the oscillation characteristics has an oscillational frequency range, said selecting one of the oscillation characteristics includes selecting one of the identified oscillation characteristics that has a frequency range including the frequency of the cycle signal and has a smaller gain.

3. The method according to claim 1, wherein each of the oscillation characteristics has an oscillational frequency range, said selecting one of the oscillation characteristics includes selecting one of the identified oscillation characteristics that has a frequency range with a generally middle part in which the frequency of the cycle signal is located and has a smaller gain.

4. The method according to claim 1, further comprising:
    storing the identified oscillation characteristics in a memory.

5. The method according to claim 1, wherein said sequentially identifying each of the oscillation characteristics includes:
  applying a maximum control voltage and a minimum control voltage to the voltage controlled oscillator to detect the frequency of each of two clock signals generated by the voltage controlled oscillator; and
  specifying the offset frequency and the gain of each of the oscillation characteristics from the frequencies of the two detected clock signals and the maximum and minimum control voltages.

6. The method according to claim 1, wherein said sequentially identifying each of the oscillation characteristics includes:
  applying a median voltage between a maximum control voltage and a minimum control voltage to the voltage controlled oscillator to detect the frequency of a clock signal generated by the voltage controlled oscillator; and
  predicting the offset frequency and the gain of each of the oscillation characteristics from the frequency of the detected clock signal and the median voltage.

7. The method according to claim 1, wherein the clock signal of the voltage controlled oscillator is provided to an optical disc device, and said sequentially identifying each of the oscillation characteristics, said selecting one of the oscillation characteristics, and said setting the voltage controlled oscillator with the selected oscillation characteristic are performed whenever the optical disc device is activated.

* * * * *